US012683387B2

(12) United States Patent
Sakakibara

(10) Patent No.: US 12,683,387 B2
(45) Date of Patent: Jul. 14, 2026

(54) DISTRIBUTED ELECTROSTATIC DISCHARGE PROTECTION FOR SEMICONDUCTOR DEVICE

(71) Applicant: SEMICONDUCTOR COMPONENTS INDUSTRIES, LLC, Scottsdale, AZ (US)

(72) Inventor: Mikito Sakakibara, Kumagaya (JP)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 165 days.

(21) Appl. No.: 18/503,052

(22) Filed: Nov. 6, 2023

(65) Prior Publication Data

US 2024/0348046 A1 Oct. 17, 2024

Related U.S. Application Data

(60) Provisional application No. 63/495,364, filed on Apr. 11, 2023.

(51) Int. Cl.
H02H 9/04 (2006.01)
H10D 89/60 (2025.01)
H10W 72/90 (2026.01)

(52) U.S. Cl.
CPC .......... H02H 9/046 (2013.01); H10D 89/611 (2025.01); H10D 89/921 (2025.01); (Continued)

(58) Field of Classification Search
CPC ......... H02H 9/046; H01L 24/05; H01L 24/06; H01L 2224/05554; H01L 2224/06153; (Continued)

(56) References Cited

U.S. PATENT DOCUMENTS 5,561,577 A * 10/1996 Motley ................ H10D 89/711
361/111
5,818,086 A * 10/1998 Lin ........................ H10D 89/60
257/355
(Continued)

FOREIGN PATENT DOCUMENTS

CN 103296665 B * 4/2016
CN 118057689 A * 5/2024 ........... H10D 89/921
(Continued)

OTHER PUBLICATIONS

Search Report for German Application No. 10 2024 103 876.4, mailed Nov. 7, 2024, 10 pages (w/full English translation).

*Primary Examiner* — Dharti H Patel
(74) *Attorney, Agent, or Firm* — Brake Hughes Bellermann LLP

(57) ABSTRACT

In a general aspect, a circuit includes a first ESD protection circuit having a first terminal and a second terminal, and a second ESD protection circuit having a first terminal and a second terminal. The second terminal of the second ESD protection circuit is coupled with the second terminal of the first ESD protection circuit. The circuit further includes a third ESD protection circuit having a first terminal and a second terminal. The second terminal of the third ESD protection circuit is coupled with the second terminal of the first ESD protection circuit and the second terminal of the second ESD protection circuit.

22 Claims, 8 Drawing Sheets

(52) U.S. Cl.
CPC ........ *H10D 89/931* (2025.01); *H10W 72/932*
(2026.01); *H10W 72/9445* (2026.01)

(58) Field of Classification Search
CPC ... H01L 2924/10329; H01L 2924/1421; H01L
2924/14215; H10D 89/611; H10D
89/921; H10D 89/931
USPC .......................................................... 361/56
See application file for complete search history.

(56) References Cited

U.S. PATENT DOCUMENTS

| | | | | |
|---|---|---|---|---|
| 5,859,758 A * | 1/1999 | Kim | ........................ | H02H 9/046 |
| | | | | 361/111 |
| 5,991,135 A * | 11/1999 | Saleh | .................... | H10W 42/60 |
| | | | | 361/111 |
| 6,181,540 B1 | 1/2001 | Schoenfeld | .......... | H10D 89/611 |
| | | | | 361/56 |
| 6,426,854 B1 * | 7/2002 | Allen | ............... | H03K 19/00315 |
| | | | | 327/321 |
| 6,680,839 B2 * | 1/2004 | Napiorkowski | ........ | H04M 3/18 |
| | | | | 361/111 |
| 7,468,638 B1 * | 12/2008 | Tsai | ......................... | H04B 1/48 |
| | | | | 331/126 |
| 8,698,139 B2 * | 4/2014 | Bazarjani | ............ | H10D 89/601 |
| | | | | 361/111 |
| 9,685,949 B2 | 6/2017 | Yamamoto et al. | | |
| 9,735,142 B2 | 8/2017 | Asano et al. | | |
| 9,882,377 B2 * | 1/2018 | La Rosa | ............. | H10D 89/611 |
| 10,158,029 B2 * | 12/2018 | Parthasarathy | .......... | H10D 8/60 |
| 11,791,625 B2 * | 10/2023 | Xu | ........................ | H02H 9/046 |
| | | | | 361/56 |
| 2003/0123208 A1 * | 7/2003 | Napiorkowski | ........ | H04M 3/18 |
| | | | | 361/119 |
| 2004/0095699 A1 | 5/2004 | Kohno | | |
| 2005/0078419 A1 * | 4/2005 | Stockinger | .......... | H10D 89/601 |
| | | | | 361/56 |
| 2005/0088791 A1 * | 4/2005 | Wang | ................... | H10D 89/601 |
| | | | | 361/111 |

| | | | | |
|---|---|---|---|---|
| 2007/0133137 A1 * | 6/2007 | Dornbusch | .......... | H10D 89/601 |
| | | | | 361/56 |
| 2007/0182444 A1 * | 8/2007 | Tanaka | ................. | H10D 89/921 |
| | | | | 326/21 |
| 2008/0080107 A1 * | 4/2008 | Chow | .................. | H10D 89/921 |
| | | | | 361/56 |
| 2008/0137245 A1 * | 6/2008 | Hiraoka | ............... | H10D 89/611 |
| | | | | 361/56 |
| 2010/0188788 A1 * | 7/2010 | Padden | ................ | H10D 89/601 |
| | | | | 361/56 |
| 2011/0267725 A1 * | 11/2011 | Scuderi | ................ | H10D 89/611 |
| | | | | 361/56 |
| 2012/0081821 A1 * | 4/2012 | Li | ........................... | H02H 9/046 |
| | | | | 361/56 |
| 2012/0154960 A1 | 6/2012 | Tsai et al. | | |
| 2012/0300349 A1 * | 11/2012 | Abou-Khalil | .......... | H02H 9/046 |
| | | | | 716/102 |
| 2013/0027824 A1 * | 1/2013 | Hayano | ............... | H10D 89/921 |
| | | | | 361/56 |
| 2013/0027834 A1 * | 1/2013 | Smith | .................. | H10D 89/711 |
| | | | | 361/212 |
| 2013/0083438 A1 * | 4/2013 | Lee | ....................... | H10D 89/601 |
| | | | | 361/56 |
| 2013/0335099 A1 * | 12/2013 | Di Sarro | .................. | H02H 9/04 |
| | | | | 324/537 |
| 2013/0342940 A1 * | 12/2013 | Taghizadeh Kaschani | ................. | |
| | | | | H02H 9/046 |
| | | | | 361/56 |
| 2016/0218503 A1 * | 7/2016 | La Rosa | ............. | H10D 89/611 |
| 2020/0286889 A1 * | 9/2020 | Salcedo | ............. | H10D 12/211 |
| 2020/0294992 A1 * | 9/2020 | Hung | .................... | H02H 9/046 |
| 2023/0154918 A1 * | 5/2023 | Kuo | ....................... | H10D 89/60 |
| | | | | 361/56 |
| 2023/0223394 A1 * | 7/2023 | Stockinger | .......... | H10D 89/611 |
| | | | | 361/56 |
| 2023/0238793 A1 * | 7/2023 | Yeh | ......................... | H02H 3/08 |
| | | | | 361/100 |

FOREIGN PATENT DOCUMENTS

| | | | | |
|---|---|---|---|---|
| JP | 2006333470 A * | 12/2006 | ............ | H03K 17/74 |
| WO | WO-2007053272 A2 * | 5/2007 | ............ | H02H 9/046 |

* cited by examiner

400

440c

443e

440e

430e

442e

440f 442b
440b
430b

443b

440d

442a

440a

430a

443a

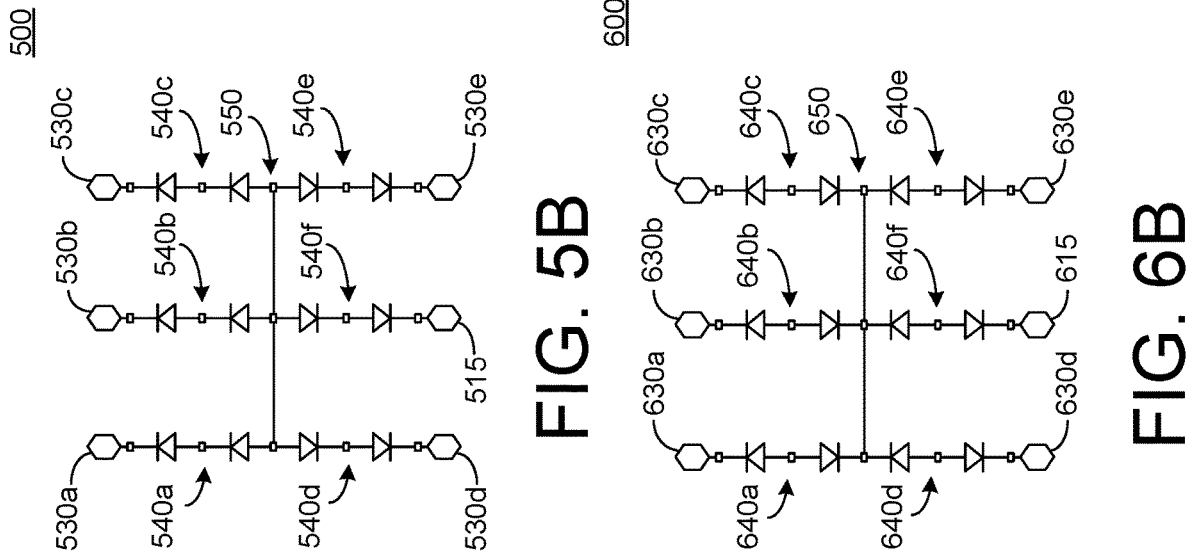
FIG. 5B
FIG. 6B
FIG. 5A
FIG. 6A

DISTRIBUTED ELECTROSTATIC DISCHARGE PROTECTION FOR SEMICONDUCTOR DEVICE

RELATED APPLICATION

This application claims priority to and the benefit of U.S. Provisional Application No. 63/495,364, filed Apr. 11, 2023, which is incorporated herein by reference in its entirety.

TECHNICAL FIELD

This disclosure relates to semiconductor circuits, such as circuits that can be implemented in a semiconductor device. More specifically, this disclosure relates to circuits for providing protection for semiconductor devices from electrostatic discharge events.

BACKGROUND

Semiconductor devices are used in numerous applications, such as consumer electronics, automotive electronics, industrial electronics, etc. In some implementations, semiconductor devices can be implemented in systems, applications and/or environments with stringent reliability requirements, such as automotive applications, etc. For instance, one such requirement is that a semiconductor device remain functional, or undamaged after being subjected to electrostatic discharge ESD testing of a specific type and magnitude, e.g., 1 kilovolt (kV) human body model (HBM) testing.

In prior implementations, ESD protection circuitry of a semiconductor device can include a plurality of ESD protection circuits that are respectively configured to absorb an ESD event (e.g., safely dissipated associated current and voltage) at a specified level for a given device. That is, each ESD protection circuit is configured to absorb an ESD event of a specified magnitude (e.g., 1 kV HBM in the above example). For instance, respective ESD protection circuits can be coupled between adjacent (or proximate) signal and/or power pads, e.g., wire bond pads, solder ball grid pads, etc. (hereafter "pads"). In addition to providing ESD protection, prior ESD protection circuits are configured to provide electrical isolation between associated pads during normal operation of an associated circuit, e.g., prevent unwanted current and/or voltage from being communicated between pads through the associated ESD protection circuits.

For instance, in prior semiconductor device implementations, a respective ESD protection circuitry is included between every two adjacent (or proximate) pads, such that a number of ESD protection circuits of the device is equal to a number of pads of the device. In such implementations, each ESD protection circuit is configured to be capable of surviving (absorbing) ESD events at a specified level, as well as providing isolation between corresponding pads during normal (functional) operation. Such approaches have certain drawbacks, however, such as an area, e.g., semiconductor die area, used to implement the ESD protection circuits and parasitic impedance (e.g., capacitance) associated with prior ESD protection circuit implementations.

SUMMARY

In a general aspect, a circuit includes a first ESD protection circuit having a first terminal and a second terminal, and a second ESD protection circuit having a first terminal and a second terminal. The second terminal of the second ESD protection circuit is coupled with the second terminal of the first ESD protection circuit. The circuit further includes a third ESD protection circuit having a first terminal and a second terminal. The second terminal of the third ESD protection circuit is coupled with the second terminal of the first ESD protection circuit and the second terminal of the second ESD protection circuit.

In another general aspect, a semiconductor device includes an active circuit, a first bond pad coupled with the active circuit, a second bond pad coupled with the active circuit, a third bond pad coupled with the active circuit, a first ESD protection circuit coupled between the first bond pad and a bridge node, a second ESD protection circuit coupled between the second bond pad and the bridge node, and a third ESD protection circuit coupled between the third bond pad and the bridge node.

In another general aspect, a circuit includes a semiconductor substrate, an active circuit implemented in the semiconductor substrate, a first bond pad disposed on the semiconductor substrate and coupled with the active circuit, a second bond pad disposed on the semiconductor substrate and coupled with the active circuit, and a third bond pad disposed on the semiconductor substrate and coupled with the active circuit. The circuit further includes a first ESD protection circuit implemented in the semiconductor substrate. The first ESD protection circuit is coupled between the first bond pad and a bridge node of the circuit. The circuit also includes a second ESD protection circuit implemented in the semiconductor substrate. The second ESD protection circuit is coupled between the second bond pad and the bridge node. The circuit also further includes a third ESD protection circuit implemented in the semiconductor substrate. The third ESD protection circuit being is coupled between the third bond pad and the bridge node.

BRIEF DESCRIPTION OF THE DRAWINGS

FIGS. 5A and 5B are schematic diagrams illustrating example ESD protection circuits including ESD diodes that operate in reverse mode.

FIGS. 6A and 6B are schematic diagrams illustrating example ESD protection circuits including ESD diodes that operate in reverse mode.

Figure 1:
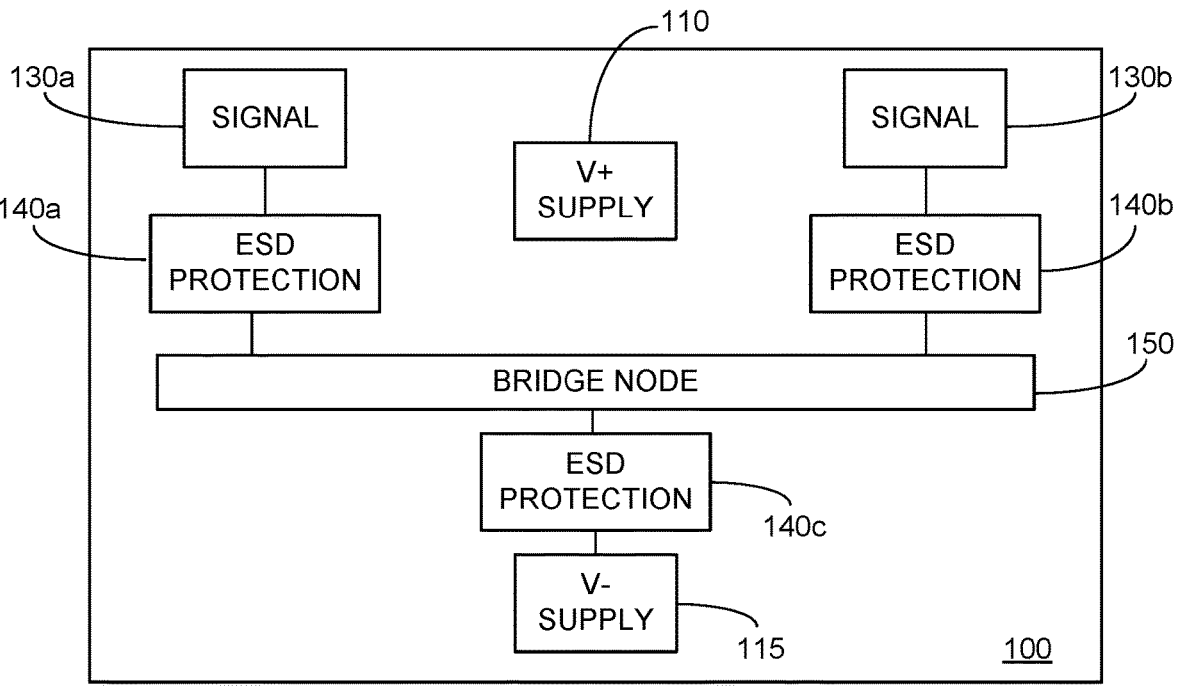
FIG. 1 is a block diagram schematically illustrating an example semiconductor device including distributed ESD protection circuits.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of that element are illustrated.

DETAILED DESCRIPTION

This disclosure is directed to approaches for implementing distributed ESD protection circuits in semiconductor devices. The approaches described herein can be implemented using ESD protection diodes (ESD diodes, diodes, protection diodes, etc.) and can overcome, at least in part, the drawbacks of prior approaches. For instance, using the approaches described herein, ESD protection circuits can be implemented using half, or less than half of the area of prior implementations. Furthermore, using the approaches described herein, ESD protection circuits can be implemented with reduced parasitic impedance (e.g., capacitance) as compared to prior approaches.

As noted above, in some previous implementations, ESD protection circuits are implemented between adjacent, or proximate signal and/or power supply pads, e.g., wire bond pads, solder ball array pads, etc. (hereafter "pads") of a semiconductor device. For instance, in such approaches, the pads and the ESD protection circuits schematically form a ring with a daisy-chain arrangement with a sequence of pad. ESD protection circuit, pad, ESD protection circuit, etc. Each of the ESD circuits is configured to provide a specified level of ESD protection for ESD events on occurring on the corresponding pads, e.g., the ability to withstand 1 kilovolt (kV) human body model (HBM) ESD events.

Further, such ESD protection circuits may be configured to electrically isolate their associated pads from one another during normal operation of an associated device, e.g., prevent any significant unwanted transfer of voltage and/or current between the pads through the ESD protection circuit. For instance, if a peak voltage potential between two pads during normal operation is 10 volts (V), e.g., a potential with an absolute value of 10 V, then a corresponding ESD protection circuit coupled between them would be configured to provide electrical isolation for at least 10 V during normal operation, typically with some amount of isolation margin (e.g., 20 percent margin, or isolation for a potential with a 12 V absolute value). Such isolation margins can vary and will depend, at least in part, on the particular implementation.

In this disclosure, for purposes of illustration and by way of example, implementations of distributed ESD protection are generally described for radio-frequency (RF) switch devices. It is noted, however, that the described approaches can be implemented in other devices, such as low noise amplifiers (LNAs), RF transistor, RF front-end modules (e.g., LNA and RF switch), and so forth.

Briefly, with respect to the example RF switch implementations described herein, an RF switch can operate to switch an RF signal received on an input port between multiple output ports. For instance, an RF switch that is configured to switch an RF signal received on an input port between two output ports can be referred to as a single pole, double throw (SPDT or SP2T) RF switch. An RF switch that is configured to switch an RF signal received on an input port between three output ports can be referred to as a single pole, triple throw (SPTT or SP3T) RF switch.

RF switches can also be classified by an RF power rating corresponding to power of RF signals for which they are configured to provide switching. Such power ratings can be expressed in decibel-milliwatts (dBm). In an example implementation, an SPDT RF switch can be a 30 dBm rated switch. That is, in this example, the RF switch is configured to switch a received RF signal with an RF power of up to 30 dBm between a first output port (terminal) and a second output port (terminal). For a 50 ohm input impedance of on input port of the RF switch, this can equate to RF signals with a root-mean-square voltage of 7.07 V, or a 20 V peak-to-peak signal amplitude (e.g., absolute value of 10 V).

Such RF switch devices, as well as other devices, can have an ESD specification, indicating a lower-limit for a magnitude of an ESD event the device can be exposed to without damage. For instance, in some implementations, a device can have a 1 kV HBM specification, indicating that the device can be subjected to ESD pulses of greater than or equal to 1 kV, in accordance with a HBM standard, without permanent damage (e.g., the device remains functional per its operating specifications after ESD exposure at the specified level). In prior implementations, each ESD protection circuit, e.g., between two pads, includes a plurality of ESD diodes, such as ESD diodes that are configured to conduct current associated with an ESD event of greater than or equal to a specified value, such as 1 kV HBM, as well as provide the desired electrical isolation during normal operation.

Continuing with the foregoing example of a 30 dBm rated RF switch, in prior implementations, each ESD protection circuit can include two sets of twelve series-connected ESD diodes (e.g., each diode having a forward voltage ($V_f$) of 1 V), that are connected in an anti-parallel configuration. That is, each ESD circuit can include twenty-four such ESD diodes where schematically, from either of the two pads, one serial chain of twelve ESD diodes (with a total $V_f$ of 12 V) is connected in a first polarity (e.g., anode, cathode, anode, cathode, etc.), while the other chain of twelve series-connected diodes (also with a total $V_f$ of 12 V) is, from a same point of reference, connected in a second polarity (e.g., cathode, anode, cathode, anode, etc.). Accordingly, in an RF switch (or other device) that includes six pads and six such ESD protection circuits, a total of one-hundred and forty-four ESD diodes are included in the device (i.e., twenty-four ESD diodes in each ESD protection circuit times six ESD protection circuits, in this example). As ESD diodes are large structures when implemented in silicon, such prior approaches can increase product cost as a result of increased semiconductor die size associated with the ESD diodes.

FIG. 1 is a block diagram schematically illustrating an example semiconductor device 100 including distributed ESD protection circuits. The approach illustrated in FIG. 1, as well as in other implementations described herein, can reduce a number of ESD diodes over prior implementations by fifty percent or more. In other words, using the approaches for implementing ESD protection circuits described herein, semiconductor die area utilized by ESD protection circuitry can be reduced by at least half, as compared to prior approaches.

In the example of FIG. 1, the semiconductor device 100 includes a V+ supply pad 110, a V-supply pad 115, a signal pad 130*a*, and a signal pad 130*b*. The semiconductor device 100 further includes an ESD protection circuit 140*a*, an ESD protection circuit 140*b*, an ESD protection circuit 140*c*, and a bridge node 150. As shown in FIG. 1, the ESD protection circuit 140*a* is coupled between the signal pad 130*a* and the bridge node 150, the ESD protection circuit 140*b* is coupled between the signal pad 130*b* and the bridge node 150, and the ESD protection circuit 140*c* is coupled between the V-supply pad 115 and the bridge node 150. In this example, the V+ supply pad 110 does not have associated ESD protection circuitry. In other implementations, a semiconductor device can include ESD protection circuitry that is associated with a V+ supply pad. That is, using the approaches described herein, distributed ESD protection circuitry can be applied to a subset of pads of a semiconductor device, as compared to prior approaches, where respective ESD protection circuits are coupled between adjacent and/or proximate pads in a daisy-chained ring for all pads of a corresponding semiconductor device. The semiconductor device 100 can also include other circuit not specifically shown in FIG. 1, such as RF switch circuitry, LNA circuitry, etc.

For purposes of clarity, consistency with the foregoing discussion, and by way of example, the semiconductor device 100 of FIG. 1, as well as the example implementations of FIGS. 2, 3, and 4A-4E, are generally described as implementing distributed ESD protection circuitry using ESD diodes with a $V_f$ of 1 V that are configured to withstand a 1 kV HBM ESD event. Further, the examples of distributed ESD protection circuitry in the implementations of FIGS. 3, and 4A-4E are described as providing electrical isolation between pads for voltage potentials with an absolute value of 12 V. In some implementations, however, distributed ESD protection circuitry can provide electrical isolation for potentials of other values, e.g., less than 12 V, or greater than 12 V.

Figure 2:
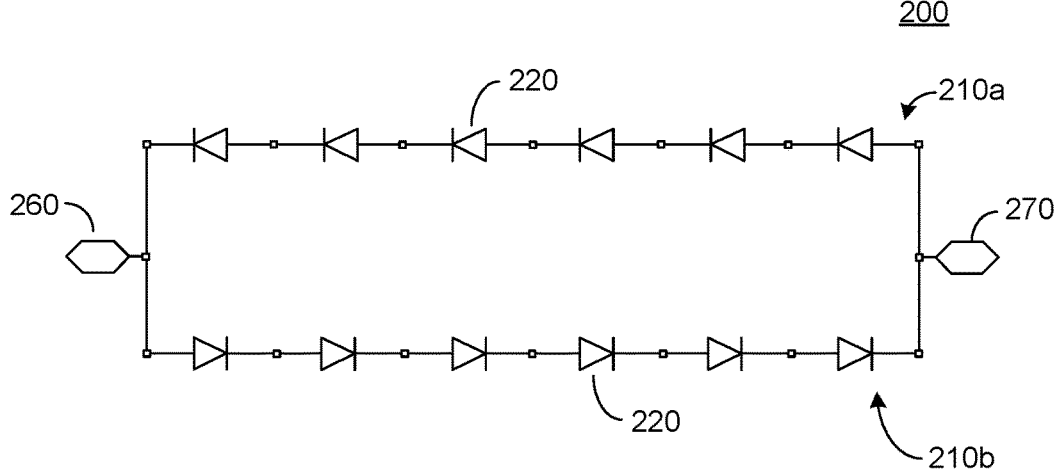
FIG. 2 is a circuit diagram of an example ESD protection circuit that can be included in the semiconductor device of FIG. 1.

In the example of the FIG. 1, the ESD protection circuit 140*a*, the ESD protection circuit 140*b* and the ESD protection circuit 140*c* can each include twelve ESD diodes coupled in an anti-parallel arrangement, where one series-connected chain of six ESD diodes (with a total $V_f$ of 6 V) is connected in a first polarity (e.g., anode, cathode, anode, cathode, etc.), while another chain of six series-connected ESD diodes (also with a total $V_f$ of 6 V) is connected in a second, opposite polarity (e.g., cathode, anode, cathode, anode, etc.). An example of such an implementation is illustrated in FIG. 2, and described in further detail below.

Accordingly, the semiconductor device 100 in this example would include thirty-six ESD diodes, as compared to prior implementations with seventy-two ESD diodes (e.g., using three ESD protection circuits of twenty-four ESD diodes each), or ninety-six ESD diodes (e.g., using four ESD protection circuits of twenty-four ESD diodes each). For instance, a prior implementation with seventy-two ESD diodes can include a daisy chained ring of three, twenty-four ESD diode circuits alternated with the signal pad 130*a*, the signal pad 130*b* and the V-supply pad 115. A prior implementation with ninety-six ESD diodes can include a daisy-chained ring of four, twenty-four ESD diode circuits alternated with the signal pad 130*a*, the V+ supply pad 110, the signal pad 130*b* and the V-supply pad 115. Accordingly, in the example of FIG. 1, distributed ESD protection for the semiconductor device 100 is implemented using one-half, or less than one-half, of the number of ESD diodes of prior implementations (e.g., thirty-six ESD diodes, as compared to seventy-two or ninety-six ESD diodes).

As noted above, FIG. 2 is a circuit diagram of an ESD protection circuit 200 (implemented using anti-parallel ESD diodes) that can be included in the semiconductor device of FIG. 1. For instance, each one of the ESD protection circuit 140*a*, the ESD protection circuit 140*b*, and the ESD protection circuit 140*c* of the semiconductor device 100 can be implemented with the ESD protection circuit 200 shown in FIG. 2. In the example of FIG. 2, the ESD protection circuit 200 includes a string 210*a* of series-connected ESD diodes 220, a string 210*b* of series-connected ESD diodes 220, a connection terminal 260, and a connection terminal 270. As noted above, the string 210*a* and the string 210*b* of the ESD protection circuit 200 are coupled in an anti-parallel configuration (e.g., in opposite polarity arrangements) between the connection terminal 260 and the connection terminal 270.

Referring again to FIG. 1, using the ESD protection circuit 200 to implement the ESD protection circuit 140*a*, the connection terminal 260 can be coupled with the signal pad 130*a* and the connection terminal 270 can be coupled with the bridge node 150. Further, using the ESD protection circuit 200 to implement the ESD protection circuit 140*b*, the connection terminal 260 can be coupled with the signal pad 130*b* and the connection terminal 270 can be coupled with the bridge node 150. Still further, using the ESD protection circuit 200 to implement the ESD protection circuit 140*c*, the connection terminal 260 can be coupled with the V-supply pad 115 and the connection terminal 270 can be coupled with the bridge node 150. In some implementations, the connections for the connection terminal 260 and the connection terminal 270 for one or more of the ESD protection circuit 140*a*, the ESD protection circuit 140*b*, and/or the ESD protection circuit 140*c* can be reversed from the arrangement described above.

In the foregoing example, use of the bridge node 150 as a common node for the connection terminal 270 for each ESD protection circuit 200 (e.g., for the ESD protection circuit 140*a*, the ESD protection circuit 140*b*, and the ESD protection circuit 140*c*) results in twelve ESD diodes being disposed between any two of the V-supply pad 115, the signal pad 130*a*, or the signal pad 130*b*. Accordingly, the distributed ESD protection circuit arrangement illustrated in FIG. 1, e.g., implemented using the ESD protection circuit 200, can provide desired ESD protection (e.g., 1k HBM), as well as desired electrical isolation between pads (e.g., isolation for voltage potentials with a 12 V absolute value) using one-half or less of the number of ESD diodes used in prior implementations.

In some implementations, ESD diodes with different ESD tolerance levels and/or different forward voltages ($V_f$) can be used to provide distributed ESD protection, such as in the examples described herein. For instance, ESD diodes that are tolerant of (prevent damage to an associated semiconductor device from) HBM ESD events of values other than 1 kV and/or have different $V_f$ than 1 V can be used. For instance, in some implementations, ESD diodes that are tolerant of a 2 kV HBM ESD event and have a $V_f$ of 2 V, though ESD diodes with different ESD tolerance levels (less than or greater than the foregoing examples), and/or can different $V_f$ (less than or greater than the examples above) could also be used. In the example semiconductor device 100 of FIG. 1 described above, using ESD diodes with a $V_f$ of 2 V, the ESD protection circuit 140*a*, ESD protection circuit 140*b* and the ESD protection circuit 140*c* could then be implemented using six anti-parallel coupled ESD diodes, e.g., three ESD diodes that are series-connected with one polarity, and three ESD diodes that are series-connected with an opposite polarity. Again, the specific ESD diode used will depend on the particular implementation.

Figure 3:
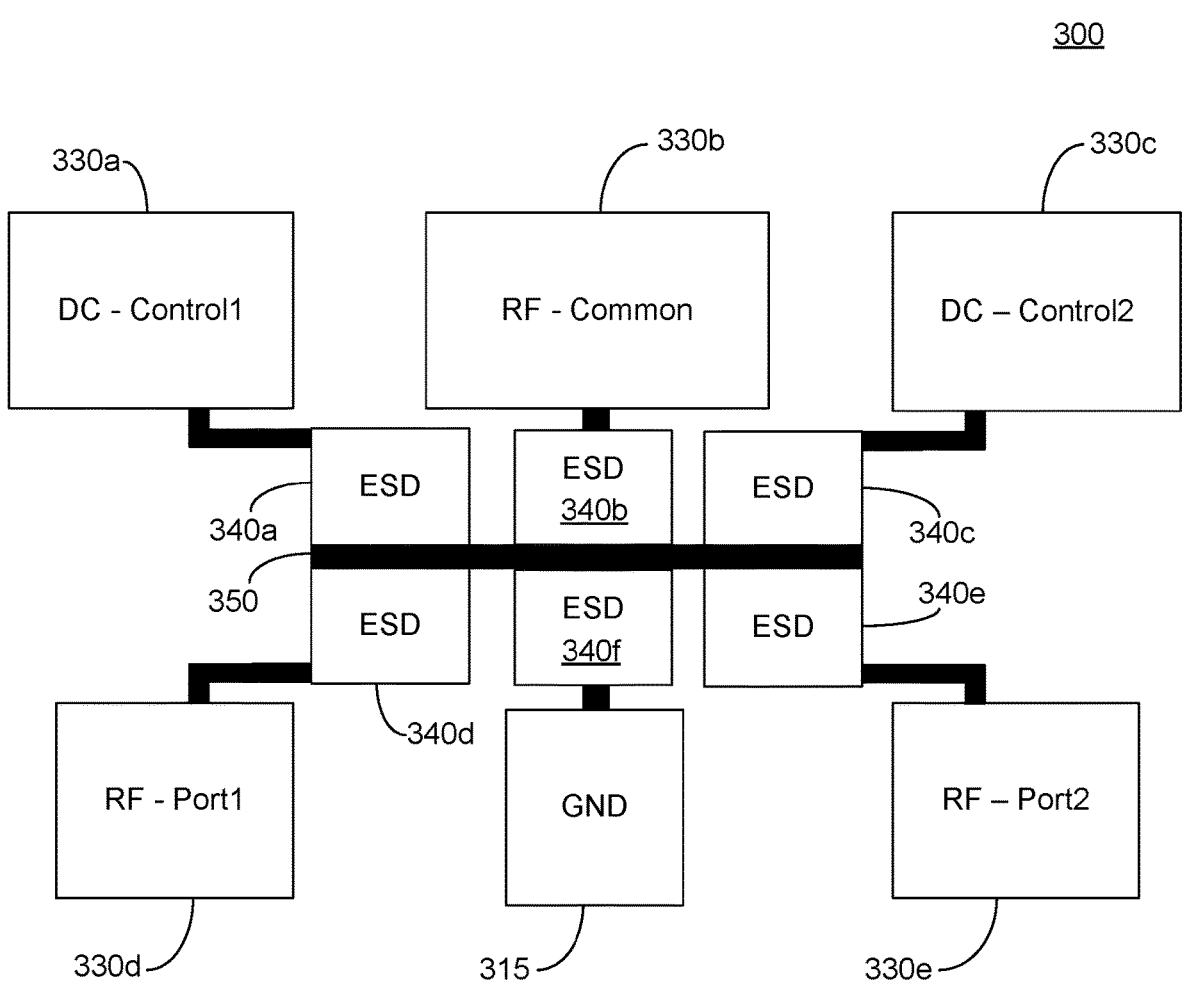
FIG. 3 is a block diagram schematically illustrating an example radio frequency (RF) switch including distributed ESD protection circuits.

FIG. 3 is a block diagram schematically illustrating an example RF switch 300 including distributed ESD protection circuits, such as in the semiconductor device 100 in the example of FIG. 1. For instance, the ESD protection circuits of the RF switch 300, in some implementations, can be implemented using the ESD protection circuit 200 of FIG. 2.

In the example of FIG. 3, the RF switch 300, which can be implemented in a semiconductor die (e.g., a gallium arsenide (GaAs semiconductor die), includes a DC-Control1 pad 330*a*, an RF-common pad 330*b*, a DC-Control2 pad 330*c*, an RF-Port1 pad 330*d*, and an RF-Port2 pad 330*c*. The RF switch 300 can also include an electrical ground pad 315 for operation of RF switch circuitry of the RF switch 300 (not specifically shown). The RF switch 300 can be configured for bidirectional communication of RF signals. That is, during normal operation of the RF switch 300 and based on voltages applied to the DC-Control1 pad 330*a* and the DC-Control2 pad 330*c*, the RF switch circuitry of the RF switch 300 can switch between communicating an RF signal (e.g., a 30 dBm RF signal) between the RF-common pad 330*b* and the pad RF-Port1 pad 330*d* (a first output port), and communicating an RF signal between the RF-common pad 330*b* and the RF-Port2 pad 330*e* (a second output port).

The RF switch 300 further includes an ESD protection circuit 340*a*, an ESD protection circuit 340*b*, an ESD protection circuit 340*c*, an ESD protection circuit 340*d*, an ESD protection circuit 340*e*, an ESD protection circuit 340*f*, and a bridge node 350. Similar to the distributed ESD protection circuits of the semiconductor device 100 shown in FIG. 1, the ESD protection circuit 340*a* is coupled between the DC-Control1 pad 330*a* and the bridge node 350, the ESD protection circuit 340*b* is coupled between the RF-common pad 330*b* and the bridge node 350, the ESD protection circuit 340*c* is coupled between the DC-Control2 pad 330*c* and the bridge node 350, the ESD protection circuit 340*d* is coupled between the RF-Port1 pad 330*d* and the bridge node 350, the ESD protection circuit 340*e* is coupled between the RF-Port2 pad 330*e* and the bridge node 350, and the ESD protection circuit 340*f* is coupled between the electrical ground pad 315 and the bridge node 350 In this example, the V+ supply pad 110 does not have associated ESD protection circuitry. However, in some implementations, an ESD protection circuit (in addition to those shown in FIG. 1) can also be associated with the V+ supply pad 110, e.g., coupled between the V+ supply pad 110 and the bridge node 150.

For purposes of clarity, consistency with the foregoing discussion, and by way of example, as was noted above, the RF switch 300 is generally described as implementing distributed ESD protection circuitry using ESD diodes with a V$_f$ of 1 V that are configured to withstand a 1 kV HBM ESD event. Further, the RF switch 300 is described as providing electrical isolation between pads for voltage potentials with an absolute value of 12 V. In some implementations, however, distributed ESD protection circuitry can provide electrical isolation for potentials of other values, e.g., less than 12 V, or greater than 12 V.

In the example of the FIG. 3, the ESD protection circuit 340*a*, the ESD protection circuit 340*b*, the ESD protection circuit 340*c*, the ESD protection circuit 340*d*, the ESD protection circuit 340*e*, and the ESD protection circuit 340*f* can be implemented using the ESD protection circuit 200 of FIG. 2, e.g., can each include twelve ESD diodes coupled in an anti-parallel arrangement, where one series-connected chain of six ESD diodes (with a total V$_f$ of 6 V) is connected in a first polarity (e.g., anode, cathode, anode, cathode, etc.), while another chain of six series-connected ESD diodes (also with a total V$_f$ of 6 V) is connected in a second, opposite polarity (e.g., cathode, anode, cathode, anode, etc.).

Accordingly, the RF switch 300, in this example, would include seventy-two ESD diodes, as compared to prior implementations with one-hundred forty-four ESD diodes (e.g., using six ESD protection circuits of twenty-four ESD diodes each). For instance, a prior implementation with one-hundred forty-four ESD diodes can include a daisy-chained ring of six, twenty-four ESD diode circuits alternated with the DC-Control1 pad 330*a*, the RF-common pad 330*b*, the DC-Control2 pad 330*c*, the RF-Port1 pad 330*d*, the electrical ground pad 315, and the RF-Port2 pad 330*e*. Accordingly, in the example of FIG. 3, ESD protection for the RF switch 300 is implemented as distributed ESD protection using one-half the number of ESD diodes of prior implementations (e.g., seventy-two ESD diodes, as compared to one-hundred forty-four ESD diodes).

Figure 4A:
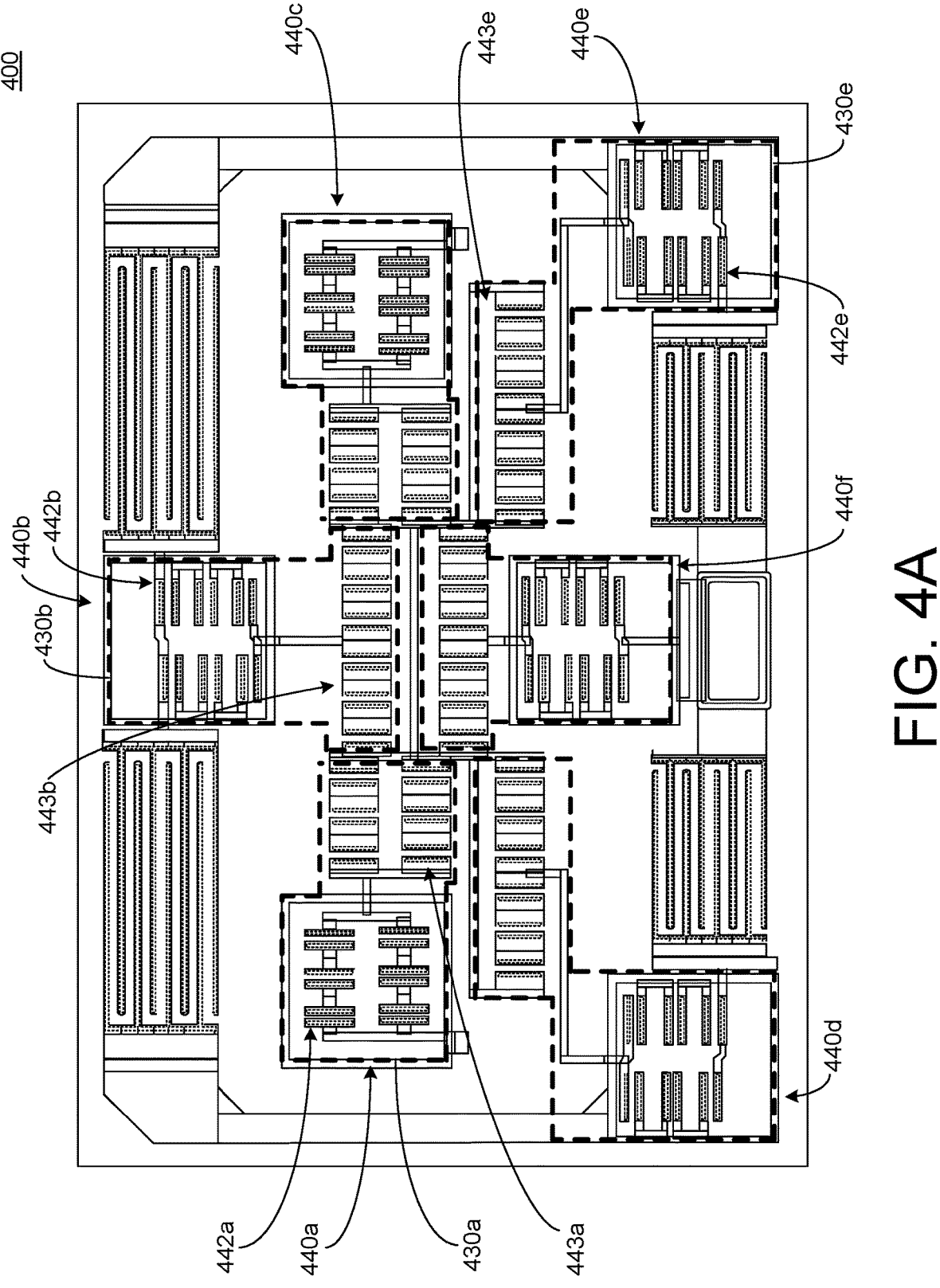
FIG. 4A is a diagram illustrating an example semiconductor device layout of an implementation of the RF switch of FIG. 3.

FIG. 4A is a diagram illustrating an example semiconductor device layout of an RF switch 400, which can be an implementation of the RF switch 300 of FIG. 3. In the example of FIG. 4A, in addition to RF switch circuitry (not specifically referenced in FIG. 4A), the RF switch 400 includes distributed ESD protection circuits corresponding with those of the RF switch 300 of FIG. 3, such as described herein. That is, for purposes of illustration and by way of example, the RF switch 400 is illustrated and described as being implemented using the ESD protection circuit 200 of FIG. 2. In some implementations, ESD protection circuits having other configurations can be used. In the example of FIG. 4A, all details of the device layout of the RF switch 400 are not shown.

In the semiconductor device layout of the RF switch 400 in FIG. 4A, the ESD protection circuits are indicated with dashed outlines. For instance, the RF switch 400 includes an ESD protection circuit 440*a*, an ESD protection circuit 440*b*, an ESD protection circuit 440*c*, an ESD protection circuit 440*d*, an ESD protection circuit 440*c*, and an ESD protection circuit 440*f*. The RF switch 400 also includes a bridge node, which is further illustrated in FIG. 4E.

Figures 4B, 4C, 4D:
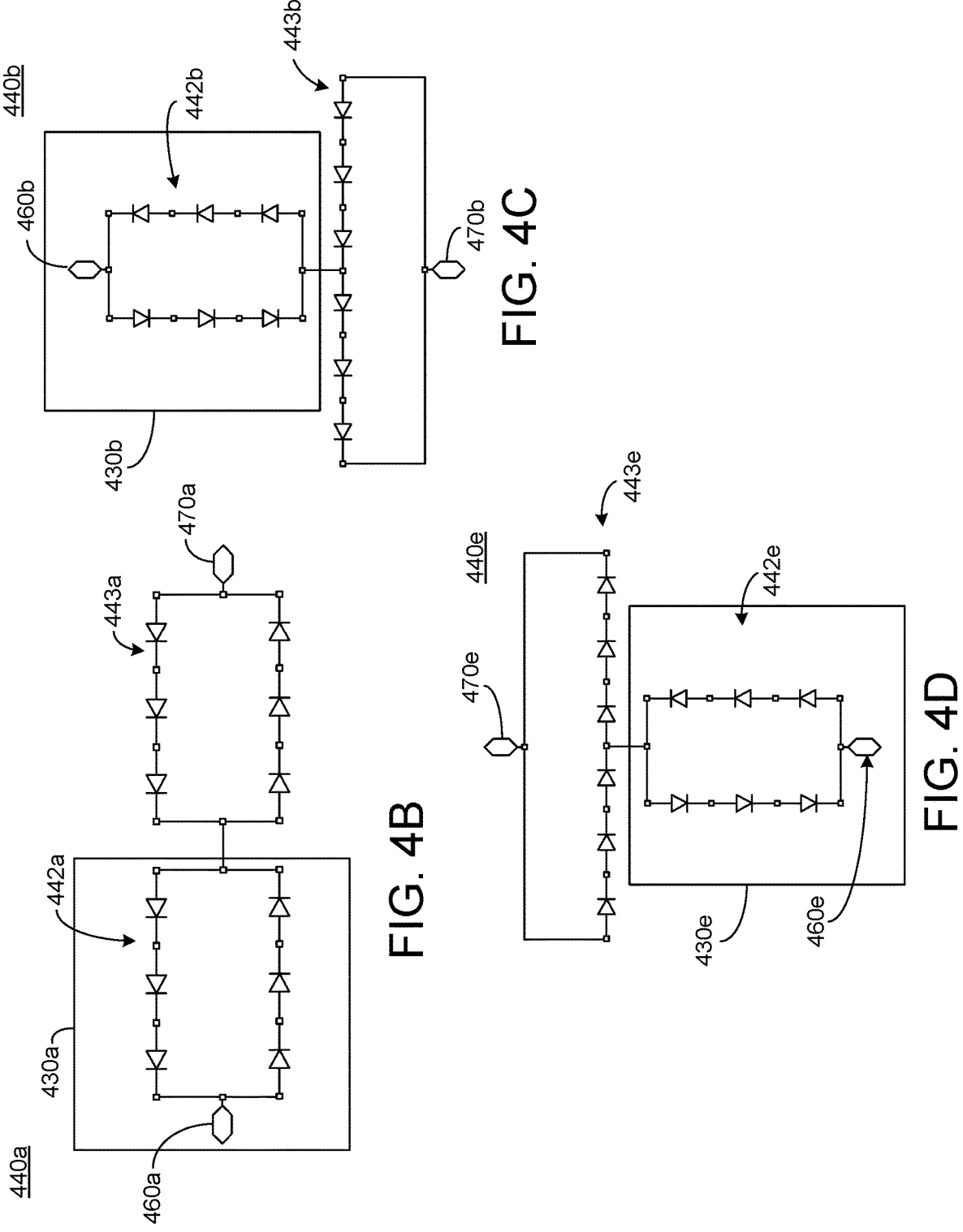
FIG. 4B through 4D are circuit and block diagrams respectively illustrating distributed ESD protection circuits of the RF switch of FIG. 4A.

By way of example and for purposes of illustration, additional details for some of the ESD protection circuits of the RF switch 400 are referenced in FIG. 4A. Specifically, additional details are shown for the ESD protection circuit 440*a*, the ESD protection circuit 440*b*, and the ESD protection circuit 440*c*. FIGS. 4B, 4C and 4D are circuit and block diagrams that respectively correspond with the ESD protection circuit 440*a*, the ESD protection circuit 440*b*, and the ESD protection circuit 440*e*. It is noted that, while not specifically referenced, the other ESD protection circuits of the RF switch 400 also include like details.

As shown in FIG. 4A, the ESD protection circuit 440*a* includes a first portion 442*a* of the anti-parallel diodes of the ESD protection circuit 440*a* (e.g., six of twelve ESD diodes), which are disposed under a pad 430*a*, such as a wire bond pad, etc. In this example, the pad 430*a* can be a pad for a DC-Control1 signal, such as shown for the RF switch 300 of FIG. 3. Such a configuration, as compared to prior implementations, can reduce input and/or output capacitance of the pad 430*a* associated with the ESD diodes of the ESD protection circuit 440*a*, For instance, in prior implementations, ESD protection circuits may not include ESD diodes that are implemented under an associated pad, which can increase input and/or output capacitance due to interconnections between the pad and ESD protection circuitry. As further shown in FIG. 4A, the ESD protection circuit 440*a* also includes a second portion 443*a* of the ESD diodes of the ESD protection circuit 440*a* (e.g., the other six ESD diodes), which are not implemented under the pad 430a, but are electrically coupled with the first portion 442a, such as shown in FIG. 4B. In this example, the first portion 442a and the second portion 443a can each include three ESD diodes of each anti-parallel string (e.g., half of the six total diodes in each series-connected string), such as shown in FIG. 4B.

As further shown in FIG. 4A, the ESD protection circuit 440b includes a first portion 442b of the anti-parallel diodes of the ESD protection circuit 440b (e.g., six of twelve ESD diodes), which are disposed under a pad 430b (e.g., a wire bond pad, etc.). In this example, the pad 430b can be a pad for an RF-Common signal, such as shown for the RF switch 300 of FIG. 3. The ESD protection circuit 440b also includes a second portion 443b of the ESD diodes of the ESD protection circuit 440b (e.g., the other six ESD diodes), which are not implemented under the pad 430b, but are electrically coupled with the first portion 442b, such as shown in FIG. 4C. In this example, the first portion 442b and the second portion 443b can each include three ESD diodes of each anti-parallel string (e.g., half of the six total diodes in each series-connected string), such as shown in FIG. 4C.

As further shown in FIG. 4A, the ESD protection circuit 440e includes a first portion 442e of the anti-parallel diodes of the ESD protection circuit 440e (e.g., six of twelve ESD diodes), which are disposed under a pad 430e (e.g., a wire bond pad, etc.). In this example, the pad 430e can be a pad for an RF-Port2 signal, such as shown for the RF switch 300 of FIG. 3. The ESD protection circuit 440e also includes a second portion 443e of the ESD diodes of the ESD protection circuit 440e (e.g., the other six ESD diodes), which are not implemented under the pad 430e, but are electrically coupled with the first portion 442e, such as shown in FIG. 4D. In this example, the first portion 442c and the second portion 443e can each include three ESD diodes of each anti-parallel string (e.g., half of the six total diodes in each series-connected string), such as shown in FIG. 4D.

FIGS. 4B through 4D, as indicated above are circuit and block diagrams respectively illustrating distributed ESD protection circuits of the RF switch of FIG. 4A. The arrangements of elements in FIGS. 4B through 4D corresponds with their arrangement in the semiconductor die layout of FIG. 4A. For instance, FIG. 4B illustrates the ESD protection circuit 440a of the RF switch 400. As shown in FIG. 4B, the first portion 442a of the ESD diodes are disposed under the pad 430a. The first portion 442a of the ESD diodes includes three diodes connected in one polarity and three connected in an opposite polarity. As further shown in FIG. 4B, the ESD protection circuit 440a includes the second portion 443a of the ESD diodes. The second portion 443a of the ESD diodes includes three diodes connected in one polarity and three connected in an opposite polarity. In this example, the ESD protection circuit 440a includes a connection terminal 460a that can be electrically coupled with the pad 430a, and a connection terminal 470a that can be electrically coupled with a bridge node of the RF switch 400.

FIG. 4C illustrates the ESD protection circuit 440b of the RF switch 400. As shown in FIG. 4C, the first portion 442b of the ESD diodes are disposed under the pad 430b. The first portion 442b of the ESD diodes includes three diodes connected in one polarity and three connected in an opposite polarity. As further shown in FIG. 4C, the ESD protection circuit 440b includes the second portion 443b of the ESD diodes. The second portion 443b of the ESD diodes includes three diodes connected in one polarity and three connected in an opposite polarity. In this example, the ESD protection circuit 440b includes a connection terminal 460b that can be electrically coupled with the pad 430b, and a connection terminal 470b that can be electrically coupled with a bridge node of the RF switch 400.

FIG. 4D illustrates the ESD protection circuit 440e of the RF switch 400. As shown in FIG. 4D, the first portion 442e of the ESD diodes are disposed under the pad 430c. The first portion 442e of the ESD diodes includes three diodes connected in one polarity and three connected in an opposite polarity. As further shown in FIG. 4D, the ESD protection circuit 440e includes the second portion 443e of the ESD diodes. The second portion 443e of the ESD diodes includes three diodes connected in one polarity and three connected in an opposite polarity. In this example, the ESD protection circuit 440c includes a connection terminal 460e that can be electrically coupled with the pad 430e, and a connection terminal 470e that can be electrically coupled with a bridge node of the RF switch 400.

Figure 4E:
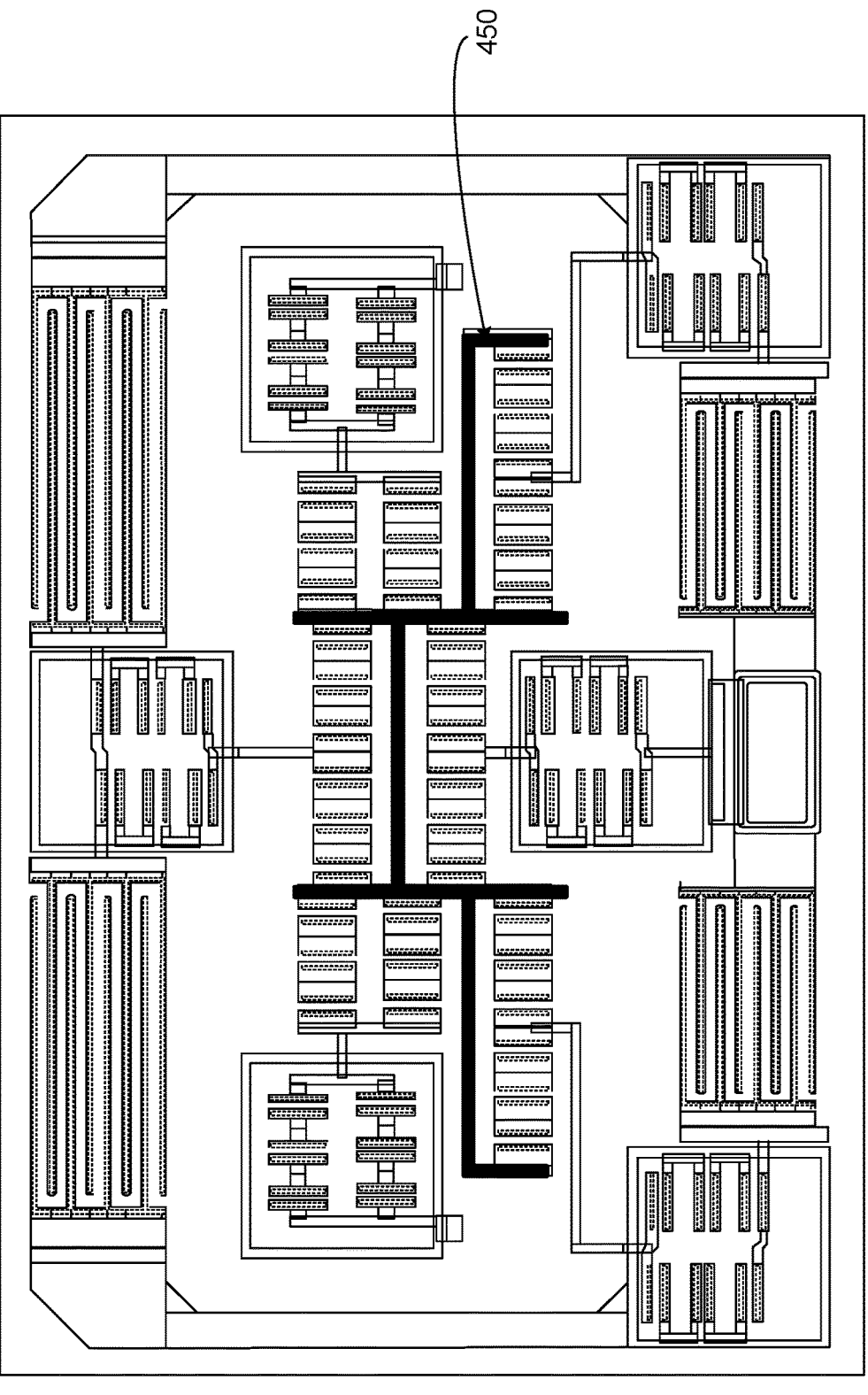
FIG. 4E is a diagram illustrating a bridge node of the distributed ESD protection circuits of the RF switch of FIG. 4A.

FIG. 4E is a diagram illustrating a bridge node 450 of the distributed ESD protection circuits of the RF switch of FIG. 4A. Specifically, FIG. 4E illustrates the semiconductor die layout of the RF switch 400 shown in FIG. 4A, with the bridge node 450 specifically indicated. In this example, the bridge node 450 can correspond with the bridge node 350 of the RF switch 300 shown in FIG. 3. That is, the ESD protection circuits 440a, 440b, 440c. 440d, 440c, and 440f of the RF switch 400 can be coupled between their respective pads and the bridge node 450. As with FIG. 4A, in the example of FIG. 4E, all details of the device layout of the RF switch 400 are not shown. In this example, the ESD protection circuit 440f can be coupled between an electrical ground pad and the bridge node 450, such as the electrical ground pad 315 of the RF switch 300.

In the example of FIGS. 4A-4E, ESD diodes that operate in forward mode when providing ESD protection are used, where the anti-parallel ESD diodes also provide electrical isolation between pads of the RF switch 400. In some implementations, ESD diodes that operate in reverse-mode, or avalanche breakdown, when providing ESD protection can be used. For instance, ESD diodes with a reverse voltage of 6 V can be used to provide ESD protection, as well as electrical isolation similar to that of the example of FIGS. 4A-4E discussed above. For purposes of this disclosure, such ESD diodes are referred to as reverse-mode ESD diodes.

FIGS. 5A and 5B are schematic diagrams illustrating example distributed ESD protection circuits that include reverse-mode ESD diodes. For instance, FIG. 5A is a circuit diagram of an ESD protection circuit 540 implemented using reverse-mode ESD diodes 520 that could be included in the semiconductor device of FIG. 1 and/or the RF switch 300 of FIG. 3. For instance, each one of the ESD protection circuit 140a, the ESD protection circuit 140b, and the ESD protection circuit 140c of the semiconductor device 100 can be implemented with the ESD protection circuit 540 shown in FIG. 5A. Likewise, each of the ESD protection circuits 340a-340f of the RF switch 300 can be implemented with the ESD protection circuit 540.

As shown in FIG. 5A, the ESD protection circuit 540 includes a string of two series-connected reverse-mode ESD diodes 520, a connection terminal 560, and a connection terminal 570. As noted above, the reverse-mode ESD diodes 520 can each have a reverse of 6 V, to provide both ESD protection and, in this example, 12 V of electrical isolation.

Referring to FIG. 5B, a schematic diagram of an ESD protection circuit 500 is illustrated. As noted above, in some implementations, the ESD protection circuit 500 can be used to implement the RF switch 300 of FIG. 3. Accordingly, for purposes of illustration, the ESD protection circuit 500 of FIG. 5B includes 500-series reference numbers that correspond with the 300-series reference numbers of FIG. 3. For instance, the ESD protection circuit 500 includes pads 530a, 530b, 530c, 530d, and 530e, as well as an electrical ground pad 515.

The ESD protection circuit 500 also includes ESD protection circuits 540a, 540b, 540c, 540d, 540e, and 540f, which are coupled between a bridge node 550 and respective pads of the pads 530a-530e and 515. The ESD protection circuits 540a-540f are implemented using the ESD protection circuit 540. In this example, respective connection terminals 560 of the ESD protection circuits 540a-540f would be coupled with their corresponding pads, such that the series-connected reverse-mode ESD diodes 520 are connected in an appropriate polarity to provide ESD protection and electrical isolation. That is, in the example of FIGS. 5A and 5B, the connections terminals 560 of the ESD protection circuits 540a-540f are coupled with pads, while the connection terminals 570 of the ESD protection circuits 540a-540f are coupled with the bridge node 550.

FIGS. 6A and 6B are schematic diagrams illustrating example distributed ESD protection circuits that also include reverse-mode ESD diodes. For instance, FIG. 6A is a circuit diagram of an ESD protection circuit 640 implemented using reverse-mode ESD diodes that could also be included in the semiconductor device of FIG. 1 and/or the RF switch 300 of FIG. 3, as with the examples of FIGS. 5A and 5B. For instance, each one of the ESD protection circuits 140a-140c of the semiconductor device 100 can be implemented with the ESD protection circuit 640 shown in FIG. 6A. Likewise, each of the ESD protection circuits 340a-340f of the RF switch 300 can be implemented with the ESD protection circuit 640.

As shown in FIG. 6A, the ESD protection circuit 640 includes a reverse-mode ESD diode 620a, a reverse-mode ESD diode 620b, a connection terminal 660, and a connection terminal 670. As noted above, the reverse mode ESD diodes 620a and 620b can each have a reverse of 6 V, to provide both ESD protection and electrical isolation. In this example, the reverse-mode ESD diode 620a and the reverse-mode ESD diode 620b are connected in a back-to-back configuration. That is, the reverse-mode ESD diode 620a and the reverse-mode ESD diode 620b, in this example, have a common anode. In some implementations, reverse-mode ESD diodes with common cathodes could also be used.

Referring to FIG. 6B, a schematic diagram of an ESD protection circuit 600 is illustrated. As noted above, in some implementations, the ESD protection circuit 600 can be used to implement the RF switch 300 of FIG. 3. Accordingly, for purposes of illustration, the ESD protection circuit 600 of FIG. 6B includes 600-series reference numbers that correspond with the 300-series reference numbers of FIG. 3. For instance, the ESD protection circuit 600 includes pads 630a, 630b, 630c, 630d, and 630e, as well as an electrical ground pad 615.

The ESD protection circuit 600 also includes ESD protection circuits 640a, 640b, 640c, 640d, 640c, and 640f, which are coupled between a bridge node 650 and respective pads of the pads 630a-630e and 615. The ESD protection circuits 640a-640f are implemented using the ESD protection circuit 640. In this example, as compared to the example of FIGS. 5A and 5B, connection terminals 660 and connection terminals 670 of the ESD protection circuits 640a-640f, due to the back-to-back ESD diode configuration, can be respectively coupled with either corresponding pads or with a bridge node 650. That is, the connection terminals 660 of the ESD protection circuits 640a-640f can be coupled with either a respective pad or with the bridge node 650, where the connection terminals 670 are then coupled with the other of the respective pad or the bridge node 650.

Figure 7A:
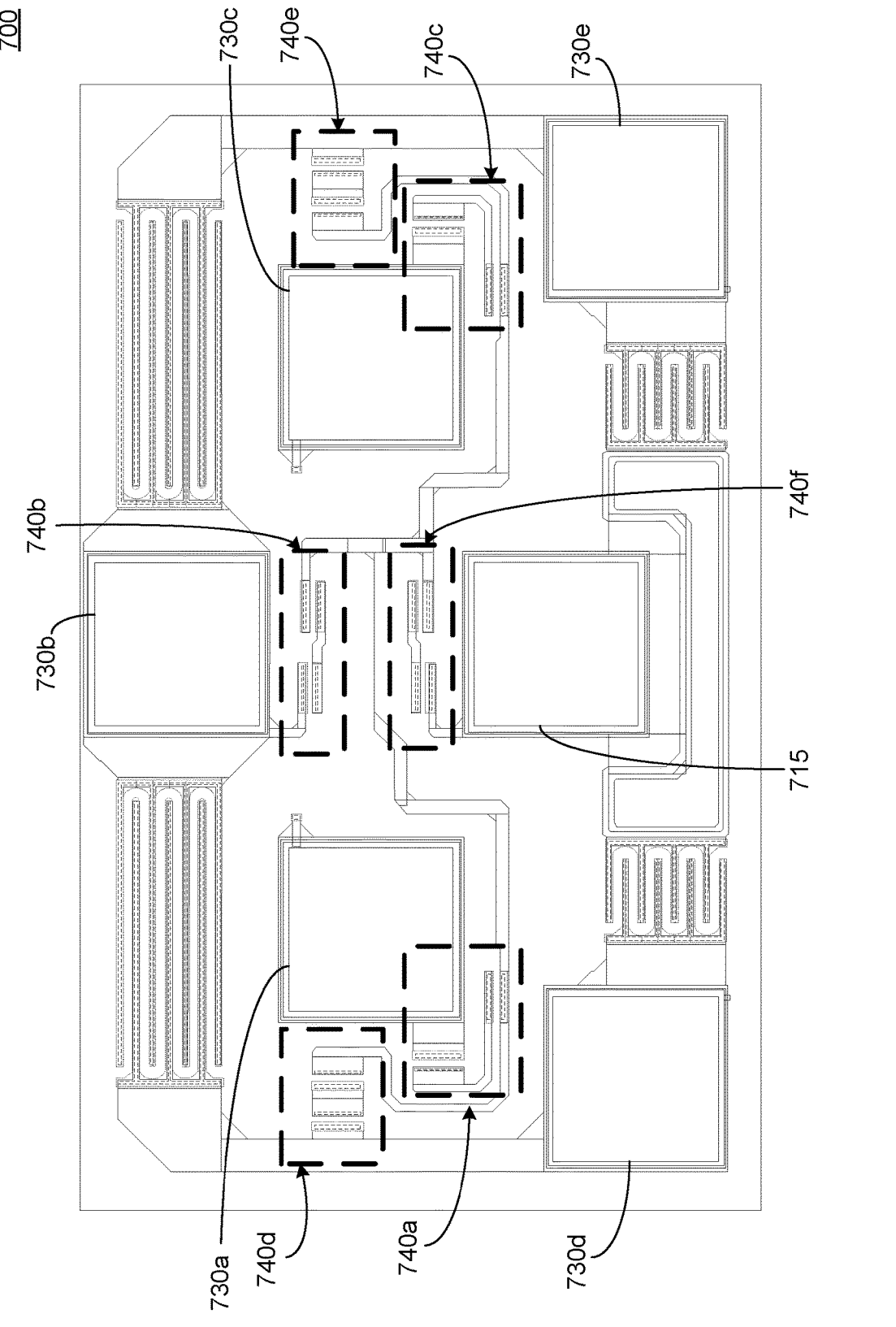
FIGS. 7A and 7B are diagrams illustrating an example device layout that can implement the ESD protection circuit of FIG. 5B or the ESD protection circuit of FIG. 6B.

FIG. 7A is a diagram illustrating an example semiconductor device layout of an RF switch 700, which can be an implementation of the RF switch 300 of FIG. 3. In the example of FIG. 7A, in addition to RF switch circuitry (not specifically referenced in FIG. 7A), the RF switch 700 includes distributed ESD protection circuitry, which can be implemented using the ESD protection circuit 500 of FIG. 5B, or the ESD protection circuit 600 of the FIG. 6B. Accordingly, for purposes of illustration and by way of example, the RF switch 700 is illustrated with 700-series reference numbers corresponding with the 500-series reference numbers of FIG. 5B, and with the 600-series reference numbers of FIG. 6B. In some implementations, distributed ESD protection circuits having other configurations can be used. In the example of FIG. 7A (and FIG. 7B), as with the RF switch 400 of FIGS. 4A and 4E, all details of the device layout of the RF switch 700 are not shown.

In the semiconductor device layout of the RF switch 700 in FIG. 7A, the ESD protection circuits are indicated with dashed outlines. For instance, the RF switch 700 includes an ESD protection circuit 740a, an ESD protection circuit 740b, an ESD protection circuit 740c, an ESD protection circuit 740d, an ESD protection circuit 740c, and an ESD protection circuit 740f. The RF switch 700 also includes a bridge node, which is further illustrated in FIG. 7B.

Figure 7B:
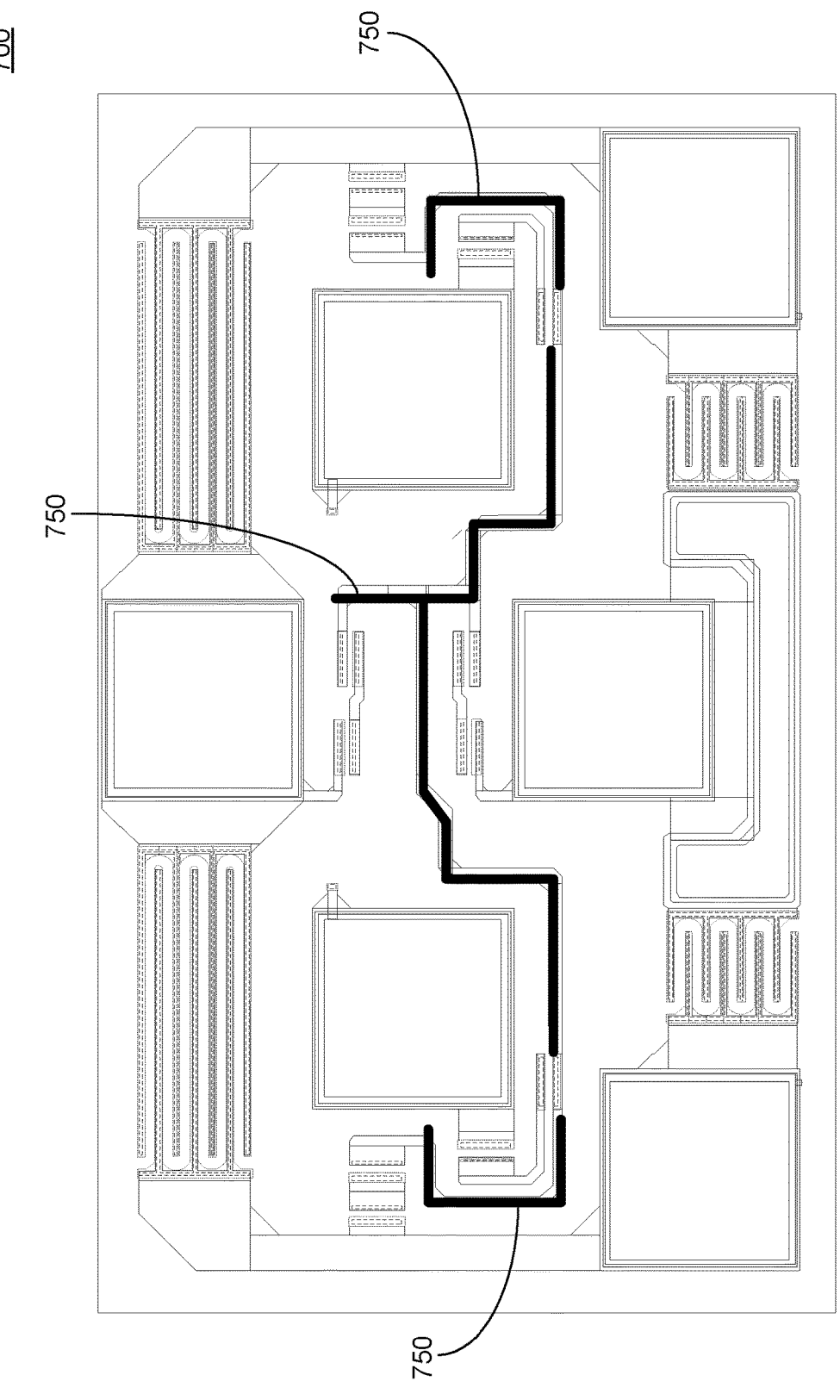

As shown in FIG. 7A, the ESD protection circuit 740a is coupled with a pad 730a, the ESD protection circuit 740b is coupled with a pad 730b, the ESD protection circuit 740c is coupled with a pad 730c, the ESD protection circuit 740d is coupled with a pad 730d, the ESD protection circuit 740e is coupled with a pad 730c, and the ESD protection circuit 740f is coupled with an electrical ground pad 715. As shown in FIG. 7B, the ESD protection circuits 740a-740f of the RF switch 700 are also each coupled with a bridge node 750 of the RF switch 700, such as in the arrangement of the ESD protection circuits 540a-540f shown in FIG. 5B, or as in the arrangement of the ESD protection circuits 640a-640f shown in FIG. 6B.

In a general aspect, a circuit includes a first ESD protection circuit having a first terminal and a second terminal, and a second ESD protection circuit having a first terminal and a second terminal. The second terminal of the second ESD protection circuit is coupled with the second terminal of the first ESD protection circuit. The circuit further includes a third ESD protection circuit having a first terminal and a second terminal. The second terminal of the third ESD protection circuit is coupled with the second terminal of the first ESD protection circuit and the second terminal of the second ESD protection circuit.

Implementations can include one or more of the following aspects or features, alone or in combination. For example, the first ESD protection circuit can include a first plurality of anti-parallel diodes. The second ESD protection circuit can include a second plurality of anti-parallel diodes. The third ESD protection circuit can include a third plurality of anti-parallel diodes.

The first terminal of the first ESD protection circuit can be coupled to a first bond pad of a semiconductor device. The first terminal of the second ESD protection circuit can be coupled to a second bond pad of the semiconductor device. The first terminal of the third ESD protection circuit can be coupled to a third bond pad of the semiconductor device.

A forward-bias voltage of the first plurality of anti-parallel diodes can be greater than one-half of a peak voltage applied between the first bond pad and the second bond pad during operation of the semiconductor device, and greater than one-half of a peak voltage applied between the first bond pad and the third bond pad during operation of the semiconductor device.

A forward-bias voltage of the second plurality of anti-parallel diodes can be greater than one-half of a peak voltage applied between the second bond pad and the first bond pad during operation of the semiconductor device, and greater than one-half of a peak voltage applied between the second bond pad and the third bond pad during operation of the semiconductor device. A forward-bias voltage of the third plurality of anti-parallel diodes can be greater than one-half of a peak voltage applied between the third bond pad and the first bond pad during operation of the semiconductor device, and greater than one-half of a peak voltage applied between the third bond pad and the second bond pad during operation of the semiconductor device.

The first ESD protection circuit, the second ESD protection circuit, and the third ESD protection circuit can be schematically equivalent.

The first terminal of the first ESD protection circuit and the second terminal of the first ESD protection circuit can be schematically equivalent. The first terminal of the second ESD protection circuit and the second terminal of the second ESD protection circuit can be schematically equivalent. The first terminal of the third ESD protection circuit and the second terminal of the third ESD protection circuit can be schematically equivalent.

In another general aspect, a semiconductor device includes an active circuit, a first bond pad coupled with the active circuit. a second bond pad coupled with the active circuit, a third bond pad coupled with the active circuit, a first ESD protection circuit coupled between the first bond pad and a bridge node, a second ESD protection circuit coupled between the second bond pad and the bridge node, and a third ESD protection circuit coupled between the third bond pad and the bridge node.

Implementations can include one or more of the following aspects or features, alone or in combination. For example, the first ESD protection circuit can include a first plurality of anti-parallel diodes. The second ESD protection circuit can include a second plurality of anti-parallel diodes. The third ESD protection circuit can include a third plurality of anti-parallel diodes.

A forward-bias voltage of the first plurality of anti-parallel diodes can be greater than one-half of a peak voltage applied between the first bond pad and the second bond pad during operation of the semiconductor device, and greater than one-half of a peak voltage applied between the first bond pad and the third bond pad during operation of the semiconductor device.

A forward-bias voltage of the second plurality of anti-parallel diodes can be greater than one-half of a peak voltage applied between the second bond pad and the first bond pad during operation of the semiconductor device, and greater than one-half of a peak voltage applied between the second bond pad and the third bond pad during operation of the semiconductor device. A forward-bias voltage of the third plurality of anti-parallel diodes can be greater than one-half of a peak voltage applied between the third bond pad and the first bond pad during operation of the semiconductor device, and greater than one-half of a peak voltage applied between the third bond pad and the second bond pad during operation of the semiconductor device.

The first bond pad can be a positive power supply terminal of the active circuit. The second bond pad can be one of a negative power supply terminal or a ground terminal of the active circuit. The third bond pad can be a signal terminal of the active circuit.

The first ESD protection circuit, the second ESD protection circuit, and the third ESD protection circuit can be schematically equivalent.

The first bond pad can be disposed on at least a portion of the first ESD protection circuit. The second bond pad can be disposed on at least a portion of the second ESD protection circuit. The third bond pad can be disposed on at least a portion of the third ESD protection circuit.

The semiconductor device can include a fourth bond pad coupled with the active circuit, and a fourth ESD protection circuit coupled between the fourth bond pad and the bridge node. The fourth bond pad can be a signal terminal of the active circuit, and can be disposed on at least a portion of the fourth ESD protection circuit. The fourth ESD protection circuit can include a plurality of anti-parallel diodes. A forward-bias voltage of the plurality of anti-parallel diodes can be greater than one-half of a peak voltage applied between the fourth bond pad and the first bond pad during operation of the semiconductor device, greater than one-half of a peak voltage applied between the fourth bond pad and the second bond pad during operation of the semiconductor device, and greater than one-half of a peak voltage applied between the fourth bond pad and the third bond pad during operation of the semiconductor device.

In another general aspect, a circuit includes a semiconductor substrate, an active circuit implemented in the semiconductor substrate, a first bond pad disposed on the semiconductor substrate and coupled with the active circuit, a second bond pad disposed on the semiconductor substrate and coupled with the active circuit, and a third bond pad disposed on the semiconductor substrate and coupled with the active circuit. The circuit further includes a first ESD protection circuit implemented in the semiconductor substrate. The first ESD protection circuit is coupled between the first bond pad and a bridge node of the circuit. The circuit also includes a second ESD protection circuit implemented in the semiconductor substrate. The second ESD protection circuit is coupled between the second bond pad and the bridge node. The circuit also further includes a third ESD protection circuit implemented in the semiconductor substrate. The third ESD protection circuit being is coupled between the third bond pad and the bridge node.

Implementations can include one of or more of the following aspects or features, alone or in combination. For example, the active circuit can include one of a radio-frequency switch, or a low-noise amplifier.

The semiconductor substrate can include a gallium arsenide (GaAs) substrate.

The apparatus and techniques described herein may be implemented using various semiconductor processing and/or packaging techniques. Some implementations may be implemented using various types of semiconductor processing techniques associated with semiconductor substrates including, but not limited to, for example, silicon (Si), gallium arsenide (GaAs), silicon carbide (SiC), gallium nitride (GaN) and/or so forth.

It will also be understood that when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present.

Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A circuit comprising:
a first electrostatic discharge (ESD) protection circuit having a first terminal, a second terminal, and a first plurality of anti-parallel diodes, the first terminal of the first ESD protection circuit being coupled with a first control signal pad;
a second ESD protection circuit having a first terminal, a second terminal, and a second plurality of anti-parallel diodes, the first terminal of the second ESD protection circuit being coupled with a second control signal pad, the second terminal of the second ESD protection circuit being directly coupled with the second terminal of the first ESD protection circuit; and
a third ESD protection circuit having a first terminal and a second terminal, the first terminal of the third ESD protection circuit being coupled with one of a power supply pad or an electrical ground pad, the second terminal of the third ESD protection circuit being directly coupled with the second terminal of the first ESD protection circuit and the second terminal of the second ESD protection circuit.

2. The circuit of claim 1, wherein:
the third ESD protection circuit includes a third plurality of anti-parallel diodes.

3. The circuit of claim 1, wherein:
the first terminal of the first ESD protection circuit is coupled to a first bond pad of a semiconductor device.

4. The circuit of claim 3, wherein a forward-bias voltage of the first plurality of anti-parallel diodes is:

greater than one-half of a peak voltage applied between the first bond pad and a second bond pad coupled to a first terminal of the second ESD protection circuit during operation of the semiconductor device; and
greater than one-half of a peak voltage applied between the first bond pad and a third bond pad coupled to a first terminal of the third ESD protection circuit during operation of the semiconductor device.

5. The circuit of claim 4, wherein:
a forward-bias voltage of a second plurality of anti-parallel diodes included in the second ESD protection circuit is:
greater than one-half of a peak voltage applied between the second bond pad and the first bond pad during operation of the semiconductor device; and
greater than one-half of a peak voltage applied between the second bond pad and the third bond pad during operation of the semiconductor device; and
a forward-bias voltage of a third plurality of anti-parallel diodes included in the third ESD protection circuit is:
greater than one-half of a peak voltage applied between the third bond pad and the first bond pad during operation of the semiconductor device; and
greater than one-half of a peak voltage applied between the third bond pad and the second bond pad during operation of the semiconductor device.

6. The circuit of claim 1, wherein the first ESD protection circuit, the second ESD protection circuit, and the third ESD protection circuit are schematically equivalent.

7. The circuit of claim 1, wherein:
the first terminal of the first ESD protection circuit and the second terminal of the first ESD protection circuit are schematically equivalent;
the first terminal of the second ESD protection circuit and the second terminal of the second ESD protection circuit are schematically equivalent; and
the first terminal of the third ESD protection circuit and the second terminal of the third ESD protection circuit are schematically equivalent.

8. The circuit of claim 1, wherein the first ESD protection circuit includes a first plurality of reverse-mode ESD diodes.

9. The circuit of claim 1, wherein the power supply pad is a negative power supply pad, the circuit further comprising:
a fourth ESD protection circuit having a first terminal and a second terminal, the first terminal of the fourth ESD protection circuit being coupled with a positive power supply pad, the second terminal of the fourth ESD protection circuit being coupled with the second terminal of the first ESD protection circuit, the second terminal of the second ESD protection circuit, and the second terminal of the fourth ESD protection circuit.

10. A semiconductor device comprising:
an active circuit;
a first bond pad coupled with the active circuit, wherein the first bond pad is a positive power supply terminal of the active circuit;
a second bond pad coupled with the active circuit, wherein the second bond pad is one of a negative power supply terminal or a ground terminal of the active circuit;
a third bond pad coupled with the active circuit, wherein the third bond pad is a signal terminal of the active circuit;
a first ESD protection circuit between and directly coupled to the first bond pad and a bridge node;

a second ESD protection circuit between and directly coupled to the second bond pad and the bridge node; and a third ESD protection circuit between and directly coupled to the third bond pad and the bridge node.

11. The semiconductor device of claim 10, wherein:

the first ESD protection circuit includes a first plurality of anti-parallel diodes;

the second ESD protection circuit includes a second plurality of anti-parallel diodes; and the third ESD protection circuit includes a third plurality of anti-parallel diodes.

12. The semiconductor device of claim 11, wherein a forward-bias voltage of the first plurality of anti-parallel diodes is:

greater than one-half of a peak voltage applied between the first bond pad and the second bond pad during operation of the semiconductor device; and greater than one-half of a peak voltage applied between the first bond pad and the third bond pad during operation of the semiconductor device.

13. The semiconductor device of claim 12, wherein:

a forward-bias voltage of the second plurality of anti-parallel diodes is:

greater than one-half of a peak voltage applied between the second bond pad and the first bond pad during operation of the semiconductor device; and greater than one-half of a peak voltage applied between the second bond pad and the third bond pad during operation of the semiconductor device; and a forward-bias voltage of the third plurality of anti-parallel diodes is:

greater than one-half of a peak voltage applied between the third bond pad and the first bond pad during operation of the semiconductor device; and greater than one-half of a peak voltage applied between the third bond pad and the second bond pad during operation of the semiconductor device.

14. The semiconductor device of claim 10, wherein the first ESD protection circuit, the second ESD protection circuit, and the third ESD protection circuit are schematically equivalent.

15. The semiconductor device of claim 10, wherein:

the first bond pad is disposed on at least a portion of the first ESD protection circuit;

the second bond pad is disposed on at least a portion of the second ESD protection circuit; and the third bond pad is disposed on at least a portion of the third ESD protection circuit.

16. The semiconductor device of claim 10, further comprising:

a fourth bond pad coupled with the active circuit; and a fourth ESD protection circuit coupled between the fourth bond pad and the bridge node, the fourth bond pad being:

a signal terminal of the active circuit; and disposed on at least a portion of the fourth ESD protection circuit.

17. The semiconductor device of claim 16, wherein the fourth ESD protection circuit includes a plurality of anti-parallel diodes.

18. The semiconductor device of claim 17, wherein a forward-bias voltage of the plurality of anti-parallel diodes is:

greater than one-half of a peak voltage applied between the fourth bond pad and the first bond pad during operation of the semiconductor device;

greater than one-half of a peak voltage applied between the fourth bond pad and the second bond pad during operation of the semiconductor device; and greater than one-half of a peak voltage applied between the fourth bond pad and the third bond pad during operation of the semiconductor device.

19. The semiconductor device of claim 10, wherein the first ESD protection circuit includes a first plurality of reverse-mode ESD diodes.

20. A circuit comprising:

a semiconductor substrate;

a radio frequency (RF) switch implemented in the semiconductor substrate;

an RF input bond pad disposed on the semiconductor substrate and coupled with the RF switch;

a first RF output bond pad disposed on the semiconductor substrate and coupled with the RF switch;

a second RF output bond pad disposed on the semiconductor substrate and coupled with the RF switch;

a first ESD protection circuit implemented in the semiconductor substrate, the first ESD protection circuit being between and directly coupled to the RF input bond pad and a bridge node of the circuit;

a second ESD protection circuit implemented in the semiconductor substrate, the second ESD protection circuit being between and directly coupled to the first RF output bond pad and the bridge node; and a third ESD protection circuit implemented in the semiconductor substrate, the third ESD protection circuit being between and directly coupled to the second RF output bond pad and the bridge node.

21. The circuit of claim 20, wherein the semiconductor substrate includes a gallium arsenide (GaAs) substrate.

22. The circuit of claim 20 further comprising:

a first control signal bond pad disposed on the semiconductor substrate and coupled with the RF switch;

a second control signal bond pad disposed on the semiconductor substrate and coupled with the RF switch;

an electrical ground bond pad disposed on the semiconductor substrate and coupled with the RF switch;

a fourth ESD protection circuit implemented in the semiconductor substrate, the fourth ESD protection circuit being directly coupled between the first control signal bond pad and the bridge node;

a fifth ESD protection circuit implemented in the semiconductor substrate, the fifth ESD protection circuit being directly coupled between the second control signal bond pad and the bridge node; and a sixth ESD protection circuit implemented in the semiconductor substrate, the sixth ESD protection circuit being directly coupled between the electrical ground bond pad and the bridge node.

* * * * *